(12) United States Patent  (10) Patent No.: US 7,944,051 B2
Kawashiro  (45) Date of Patent: May 17, 2011

(54) SEMICONDUCTOR DEVICE HAVING EXTERNAL CONNECTION TERMINALS AND METHOD OF MANUFACTURING THE SAME

(75) Inventor: Fumiyoshi Kawashiro, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 64 days.

(21) Appl. No.: 12/177,458

(22) Filed: Jul. 22, 2008

(65) Prior Publication Data
US 2009/0026615 A1    Jan. 29, 2009

(30) Foreign Application Priority Data

Jul. 23, 2007   (JP) .................. 2007-191007

(51) Int. Cl.
*H01L 23/488* (2006.01)
*H01L 21/60* (2006.01)
(52) U.S. Cl. ......... 257/738; 257/E23.023; 257/E21.514; 438/106
(58) Field of Classification Search ............... 258/738
See application file for complete search history.

(56) References Cited

U.S. PATENT DOCUMENTS

| 6,209,196 B1 * | 4/2001 | Ozono et al. ............... 29/840 |
| 6,471,115 B1 * | 10/2002 | Ijuin et al. ............. 228/180.22 |
| 7,514,350 B2 * | 4/2009 | Hashimoto ................ 438/611 |

FOREIGN PATENT DOCUMENTS

| CN | 2612071 | 4/2004 |
| JP | 11-204590 | 7/1999 |
| JP | 11-204926 | 7/1999 |
| JP | 2000-174059 | 6/2000 |
| JP | 2002-203872 | 7/2002 |

OTHER PUBLICATIONS

Chinese patent Office issued a Chinese Office Action dated Aug. 28, 2009, Application No. 2008101440272.

* cited by examiner

*Primary Examiner* — Jarrett J Stark
*Assistant Examiner* — Lawrence Tynes, Jr.
(74) *Attorney, Agent, or Firm* — Young & Thompson

(57) ABSTRACT

In one embodiment, a semiconductor device has a semiconductor element made up of a semiconductor chip, first solder balls provided on the semiconductor chip and a BGA substrate on which the semiconductor chip is mounted via the first solder balls. Furthermore, the semiconductor device has external terminals on a surface of the BGA substrate opposing to a surface on which the semiconductor chip is mounted. The external terminals include oxide films provided with through holes.

19 Claims, 6 Drawing Sheets

SEMICONDUCTOR DEVICE HAVING EXTERNAL CONNECTION TERMINALS AND METHOD OF MANUFACTURING THE SAME

This application is based on Japanese patent application No. 2007-191007, the content of which is incorporated hereinto by reference.

BACKGROUND

1. Technical Field

The present invention relates to a semiconductor device, especially a semiconductor device having external terminals, and a method of manufacturing the same.

2. Related Art

Conventional connections between semiconductor chips and electrically connectable members such as a substrate require the formation of a thin metal film for the connection. The thin metal film is generally formed through sputtering or vapor deposition. In the connection using this thin metal film, for example, solder having a high melting point is used. In the case of soldering, the oxide film formed on the surface of the solder makes the wettability and spreadability poor, and defects in mounting (failure in fusion of solder) easily occur between the bonding agent applied to the side to be mounted and the solder at the time of reflow for mounting in accordance with the specifications of the customer. Therefore, it is necessary to take measures against oxidation on the surface of the solder so that defects in mounting have to be prevented.

Japanese Laid-open patent publication No. 2002-203872, for example, discloses a technology for mechanically and physically removing oxide films on the surface of solder bumps provided on electronic parts as external connection terminals using a polishing type cleaner.

In addition, Japanese Laid-open patent publication No. 2000-174059 discloses a technology for removing oxide films on the surface of solder bumps provided on electronic parts as external connection terminals through friction by providing vibration, using an oscillator, to the substrate on which electronic parts are mounted.

In addition, Japanese Laid-open patent publication No. 11-204926 discloses a technology for removing oxide films on the surface of solder balls provided on electronic parts as external connection terminals using an oxide film removing agent made of an organic compound and a diluting agent for the oxide film removing agent.

Furthermore, there is also a technology for removing oxide films through a plasma process.

In the above described technologies for removing oxide films using a polishing type cleaner, a plasma process and an organic compound, however, static electricity may be generated. In the case of ultrasonic bonding as well, static electricity may be generated through friction. Accordingly, there may be a problem where electrostatic breakdown is caused and the quality of the semiconductor chip is lowered.

In addition, the above described problem is not limited to the cases where a semiconductor chip is connected by means of solder, but becomes a common problem in the connection of a semiconductor chip having external connection terminals made of a material other than solder.

Furthermore, solder balls made of a tin-copper alloy based material (melting temperature: approximately 220° C.) have been put into practice in recent years as external connection terminals. This tin-copper alloy based material is easily oxidized in comparison with conventional tin-lead alloy based materials. Accordingly, a problem where defects in mounting (failure infusion of solder) occur has become severe.

The present inventor has recognized that the present invention provides a measure against the oxidation of external connection terminals without generating static electricity so that defects in mounting can be reduced and an increase in the yield of assembly and an increase in the quality of bonding can be achieved.

SUMMARY

In one embodiment, there is provided a semiconductor device, comprising:
 a semiconductor element; and
 external connection terminals provided on said semiconductor chip,
 wherein said external connection terminals comprise oxide films provided with through holes.

According to the present invention, the external connection terminals include oxide films provided with through holes, and thus, the external connection terminals are melted in the reflow process bonding to other electrical connection members such as a substrate so that the shape of the external connection terminals transform into sphere, which means that the surface area of the external connection terminals becomes minimum. Therefore, the oxide film formed on the surface of the external connection terminals is broken to provide high electrical conductivity. Accordingly, it becomes unnecessary to remove oxide films when the external connection terminals are bonded to an electrical connection member so that static electricity (electrostatic breakdown) can be prevented. Therefore, it becomes possible to prevent the quality of the semiconductor chip from lowering.

In addition, in another embodiment, there is provided a method of manufacturing a semiconductor device, comprising:
 forming external connection terminals on said semiconductor element; and
 forming through holes in oxide films formed on the surface of said external connection terminals.

According to this invention, the external connection terminals include oxide films provided with through holes, and thus, the external connection terminals are melted in the reflow process bonding to other electrical connection members such as a substrate so that the shape of the external connection terminals transform into sphere, which means that the surface area of the external connection terminals becomes minimum. Therefore, the oxide film formed on the surface of the external connection terminals is broken to provide high electrical conductivity. As a result, external connection terminals connected on a semiconductor chip and an electrical connection member such as a substrate can be bonded in high electrically conductivity so that the semiconductor chip can be mounted on the electrical connection member without removing the oxide films. Accordingly, it becomes unnecessary to remove the oxide films at the time of mounting, and static electricity (electrostatic breakdown) can be prevented. Therefore, it becomes possible to prevent the quality of the semiconductor chip from lowering.

In the present invention, the semiconductor element may be a single semiconductor chip or a structure that comprises a semiconductor chip and a BGA substrate on which the semiconductor chip is mounted.

According to the present invention, a measure against the oxidation of external connection terminals can be taken while preventing static electricity. As a result, the yield in assembly and the quality of bonding can be increased while reducing defects in mounting.

BRIEF DESCRIPTION OF THE DRAWINGS

The above and other objects, advantages and features of the present invention will be more apparent from the following description of certain preferred embodiments taken in conjunction with the accompanying drawings, in which:

FIG. 1A is a view schematically showing the semiconductor device according to the embodiment, FIG. 1B is a cross sectional view along B-B' of FIG. 1A, and FIG. 1C is a cross sectional view along C-C' of FIG. 1A;

DETAILED DESCRIPTION

Figure 1A:
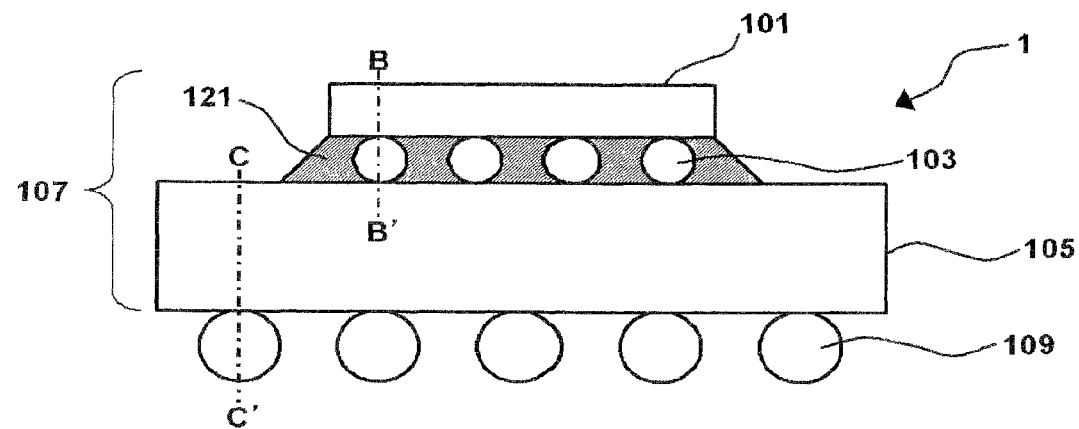
FIGS. 1A, 1B, and 1C are views schematically showing the semiconductor device according to an embodiment.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

In the following, an embodiment of the present invention is described in reference to the drawings. Here, the same reference numerals are given to the same components in all the drawings, and the descriptions will not be repeated.

Figure 1B:
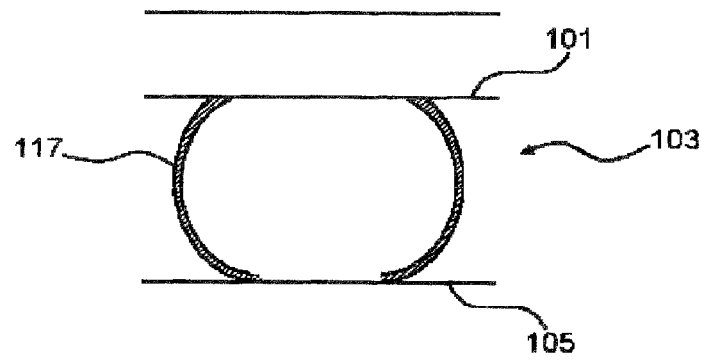
Figure 1C:
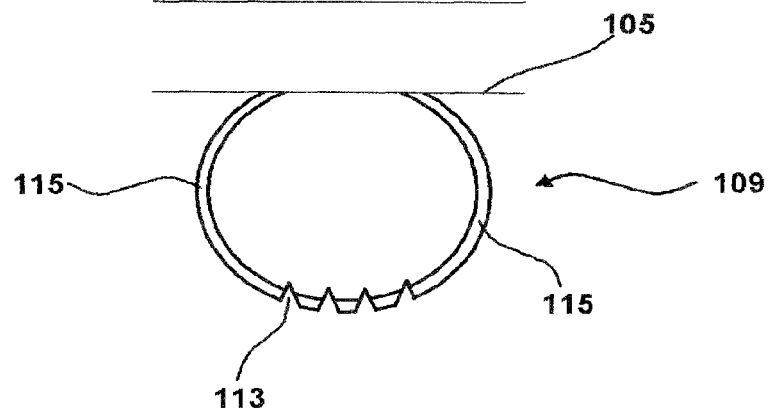

FIGS. 1A, 1B, and 1C are views schematically showing a semiconductor device 1 according to the present embodiment. FIG. 1A is a view schematically showing the semiconductor device 1 according to the present embodiment.

FIG. 1B is a cross sectional view along line B-B' of FIG. 1A. FIG. 1C is a cross sectional view along line C-C' of FIG. 1A. The semiconductor device 1 in the present embodiment has a semiconductor element 107 which is made up of a semiconductor chip 101, solder balls 103 (first solder balls) provided on the semiconductor chip 101 and a BGA substrate 105 on which the semiconductor chip 101 is mounted via the solder balls 103. Furthermore, the semiconductor device 1 has the semiconductor element 107, and solder balls 109 (second solder balls) provided on the semiconductor element 107. The solder balls 109 include oxide films 115 provided with through holes 113.

The solder bolls 103 have a solder paste 117 on the surface of the solder balls 103. The wettability on the surface of the solder balls 103 makes the solder paste 117 spread thereon through the reflow process.

The BGA substrate 105 has a plurality of the solder balls 109. The solder balls 109 is formed on the surface of the BGA substrate 105 that is opposing to a surface on which the semiconductor chip 101 is mounted. The semiconductor device 1 is connected to a printed circuit board (not shown). The semiconductor chip 101 is electrically connected to the BGA substrate 105.

It is preferable to use any material of a tin-copper alloy based material, a tin-lead alloy based material, a tin-silver alloy based material, a tin-silver-copper alloy based material, a tin-bismuth alloy based material and a tin-gold alloy based material for the solder balls 103 and 109, and a tin-copper alloy based material (melting temperature: approximately 220° C.) is more preferable. This tin-copper alloy based material is easily oxidized so that the oxide films 115 and 117 can be formed with an appropriate thickness.

The oxide films 115 and 117 are naturally formed due to the environmental temperature, the humidity and the presence of a reactive material during the storage of the semiconductor device 1. It is preferable for the thickness of the oxide films 115 to be 50 nm or less, and it is more preferable for the thickness to be 10 nm or greater and 30 nm or less. Taking practical use into consideration, the thickness may be 20 nm or greater and 25 nm or less.

The through holes 113 are created in the process for manufacturing the semiconductor device 1 or in the selecting process. The through holes 113 are formed by having a tool make contact with the oxide film 115 which covers the solder ball 109. The form of the tool is not particularly limited as long as a through hole 113 can be formed in the oxide film 115, but it is preferable for the tool to make the formation of a plurality of through holes 113 at one time possible, and a tool in crown form, for example, can be used. Concretely, a tool which may be used as a BT socket can be used. Such a tool is made to make contact with a top portion of a solder ball 109 as well as its periphery, and thus, one or more through holes 113 can be formed in the top portion of the solder ball 109 as well as in its periphery. The depth of said trough holes 113 is deeper than the thickness of said oxide films 115.

The material of the tool is not particularly limited as long as a through hole 113 can be formed in an oxide film 115, and it is preferable to use a conductive material. When a conductive material is used, static electricity can be prevented when a through hole 113 is formed. A metal can be used, for example, and a conductive material which is harder than solder and to which solder does not adhere easily may be used.

The solder paste 117 is not particularly limited as long as it has conductivity and can bond the solder balls 103 and the BGA substrate 105. It is preferable to use a solder paste 117 which includes tin, silver and copper, for example. Concretely, Sn3.0 Ag0.5 Cu or Sn3.5 Ag0.75 Cu can be used.

Figure 4A:
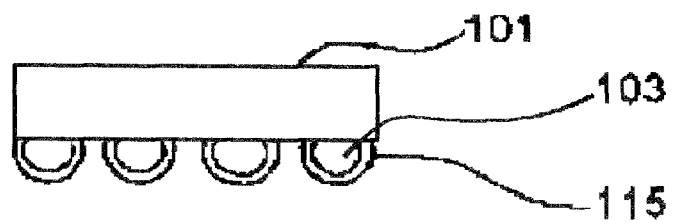
FIGS. 4A to 4E are views illustrating a method of manufacturing the semiconductor device according to the embodiment.

Next, a method of mounting the semiconductor chip 101 on the BGA substrate 105 is described in reference to FIGS. 4A to 4E. In the first step, as shown in FIG. 4A, solder balls 103 are connected to one surface of a semiconductor chip 101 through the reflow bonding method in advance. Oxide films 115 are formed on the surface of the solder balls 103 due to the environmental temperature, the humidity and the presence of a reactive material.

Figure 4B:
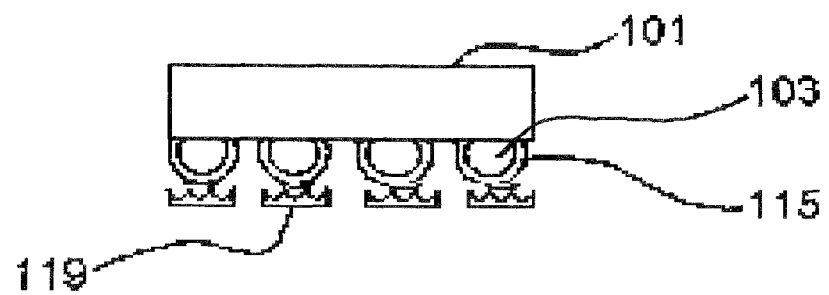
Figure 4C:
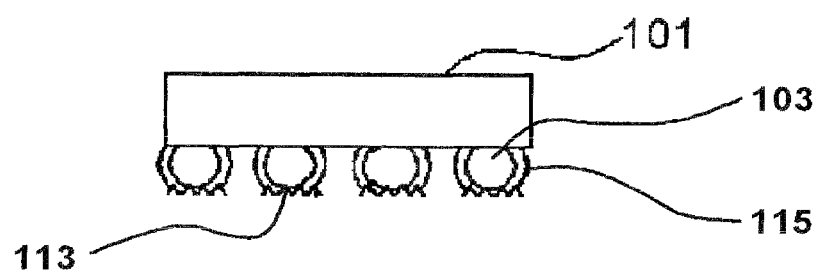

In the second step, through holes 113 are formed in the oxide films 115 formed on the surface of the solder balls 103. Concretely, as shown in FIG. 4B, appropriate tools 119 are made to make contact with the oxide films 115 on the top of the solder balls 103 and its periphery. As a result, as shown in FIG. 4C, through holes 113 are formed in the oxide films 115.

Figure 4D:
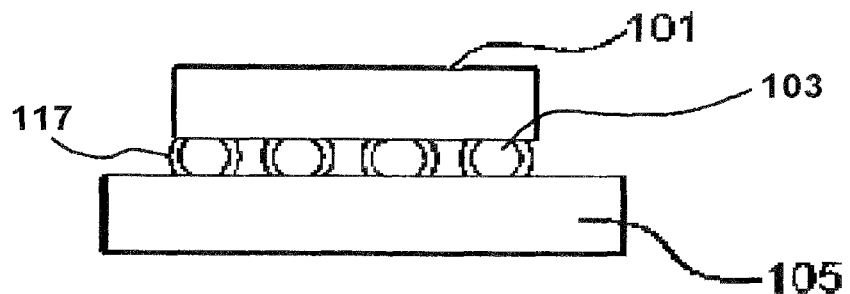
Figure 4E:
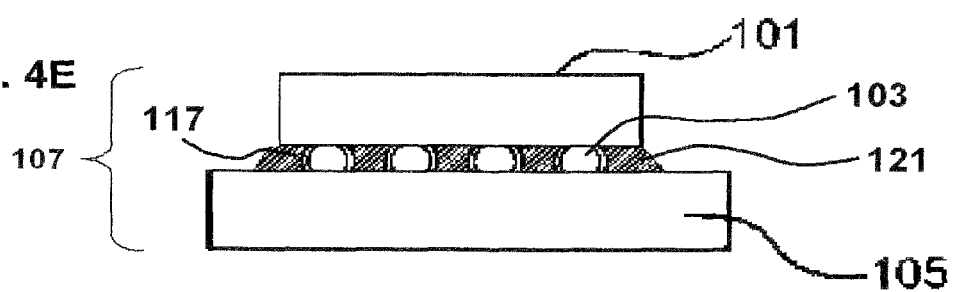

In the third step, the solder paste 117 is applied on conductive pads (not shown) of the BGA substrate. Next, the conductive pads of the BGA substrate 105 to which the solder paste 117 has been applied is made to make contact with the solder balls 103. Heat is applied to a reflow furnace so that the solder bolls 103 is melted, and the solder balls 103 and the BGA substrate 105 are bonded (FIG. 4D). At this time, the heating process transforms the shape of the solder balls 103 into sphere, which means that the surface area of the solder balls 103 becomes minimum. In other word, the surface free energy of the solder balls 103 becomes minimum. This deformation drives the oxide films 115 to break. Therefore, the solder paste 117 wets and spreads on the entire surface of the solder balls 103 appropriately. After that, in the fourth step, as shown in FIG. 4E, an underfill resin 121 is injected between the semiconductor chip 101 and the BGA substrate. As a result, the semiconductor chip 101 is mounted on the BGA substrate 105.

As described above, a semiconductor element 107 can be obtained by mounting the semiconductor chip 101 on the BGA substrate 105. The semiconductor element 107 can be mounted on a printed circuit board 111 in accordance with the same method as described above.

FIG. 5A-C and FIG. 6 show views illustrating a method of mounting the semiconductor element 101 on the printed circuit board 111.

Figure 5A:
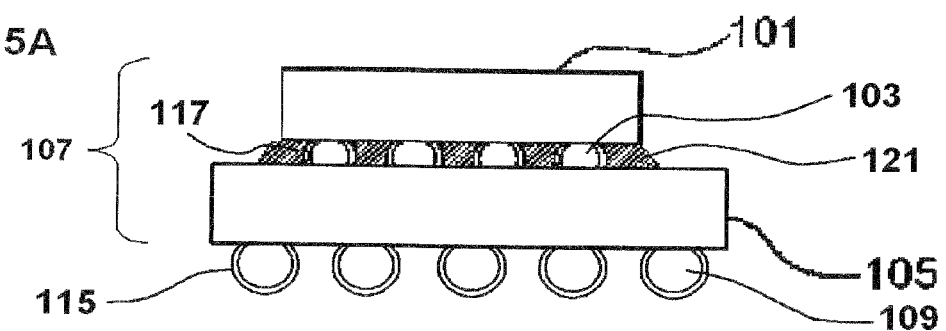
FIGS. 5A to 5C are views illustrating a method of manufacturing the semiconductor device according to the embodiment.

As shown in FIG. 5A, solder balls 109 are formed on one surface of a semiconductor element 107 through the reflow bonding method in advance. The solder balls 109 is formed on the surface of the BGA substrate 105 that is opposing to a surface on which the semiconductor chip 101 is mounted. After that, the oxide films 115 are formed on the surface of the solder balls 109 due to the environmental temperature, the humidity and the presence of a reactive material.

Figure 5B:
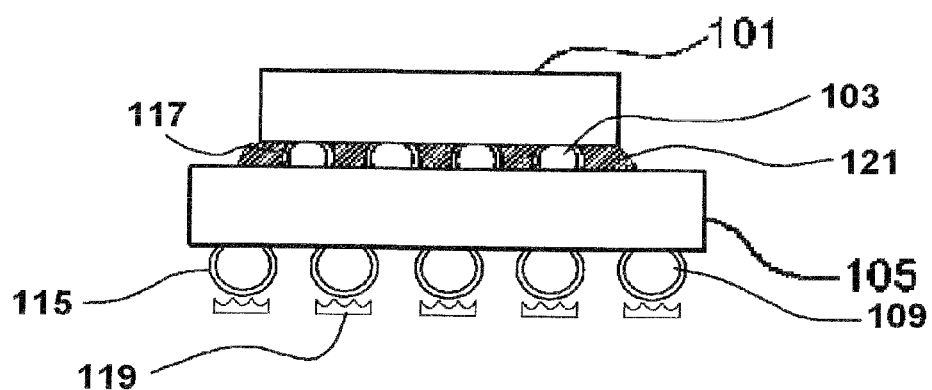
Figure 5C:
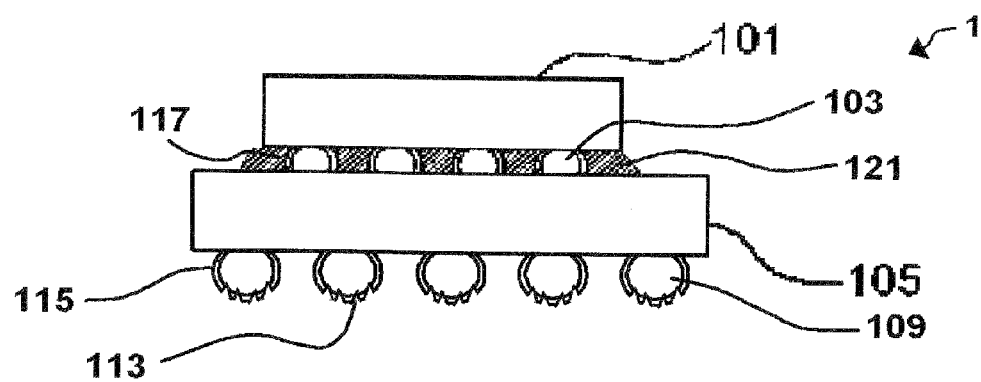

Next, through holes 113 are formed in the oxide films 115 formed on the surface of the solder balls 109. Concretely, as shown in FIG. 5B, appropriate tools 119 are made to make contact with the oxide films 115 on the top of the solder balls 109 and its periphery. As a result, as shown in FIG. 5C, through holes 113 are formed in the oxide films 115. In this way, the semiconductor device 1 is obtained.

Figure 6:
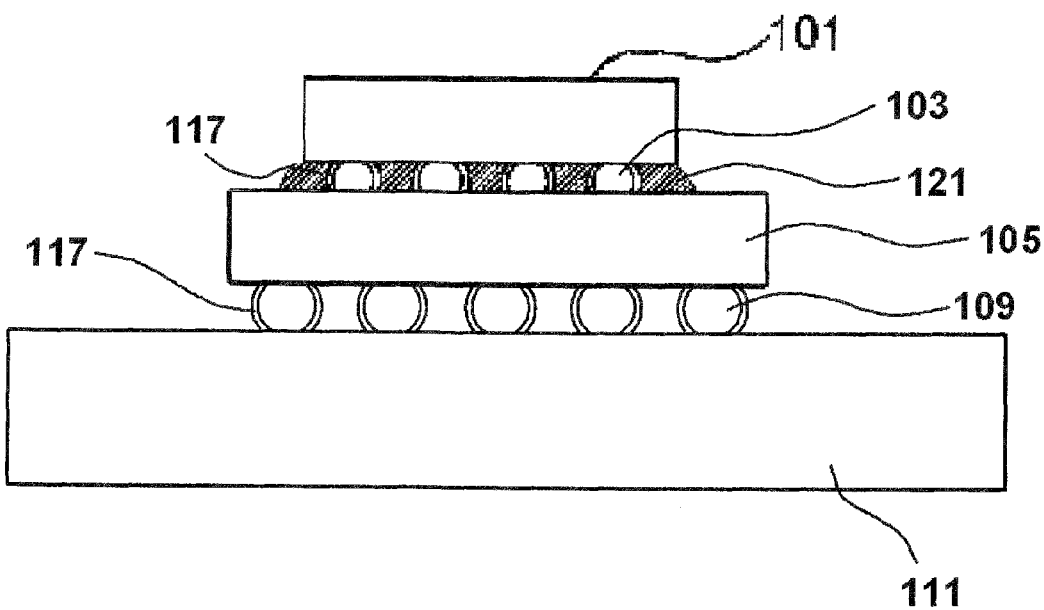
FIG. 6 is a view illustrating a method of manufacturing the semiconductor device according to the embodiment.

Next, the solder paste 117 is applied on conductive pads (not shown) of the printed circuit board 111. Then, the conductive pads of the printed circuit board 111 to which the solder paste 117 has been applied is made to make contact with the solder balls 109. Heat is applied to a reflow furnace so that the solder bolls 109 is melted, and the solder balls 109 and the printed circuit board 111 are bonded (FIG. 6). At this time, the heating process transforms the shape of the solder balls 109 into sphere, which means that the surface area of the solder balls 109 becomes minimum. In other word, the surface free energy of the solder balls 109 becomes minimum. This deformation drives the oxide films 115 to break. Therefore, the solder paste 117 wets and spreads on the entire surface of the solder balls 109 appropriately. As described above, the semiconductor element 107 is mounted on the printed circuit board 111.

Next, the advantages of the present embodiment are described.

According to the present embodiment, through holes 113 are provided in the oxide films 115 formed on the surface of the solder balls. The heating in the reflow process transforms the shape of the solder balls 103 or 109 into sphere, which means that the surface area of the solder balls 103 or 109 becomes minimum. This is because the deformation of the solder balls occurs so that the surface free energy of the solder balls 103 or 109 becomes minimum. This deformation drives the oxide films 115 to break. Therefore, the solder paste 117 wets and spreads on the entire surface of the solder balls 103 or 109 appropriately. Accordingly, it is possible to achieve high electrical conductivity via solder balls without a step of removing the oxide films 115.

In addition, the depth of the trough holes 113 can be deeper than the thickness of the oxide films 115, thus the deformation volume of the solder balls 103 or 109 increases when the solder balls 103 or 109 are melt in heat. Accordingly, it is possible to make the oxide films 115 break more effectively.

Electrostatic breakdown is caused as a result of the discharge of static electricity. The semiconductor chip 101 is coated with a thin film, such as of silicon oxide having high insulating properties. However, when high voltage electricity temporarily flows as a result of the discharge of static electricity, the film having high insulating properties is broken and the internal circuit is damaged. This is referred to as electrostatic breakdown, which causes malfunctions and deterioration of functions.

Figure 2:
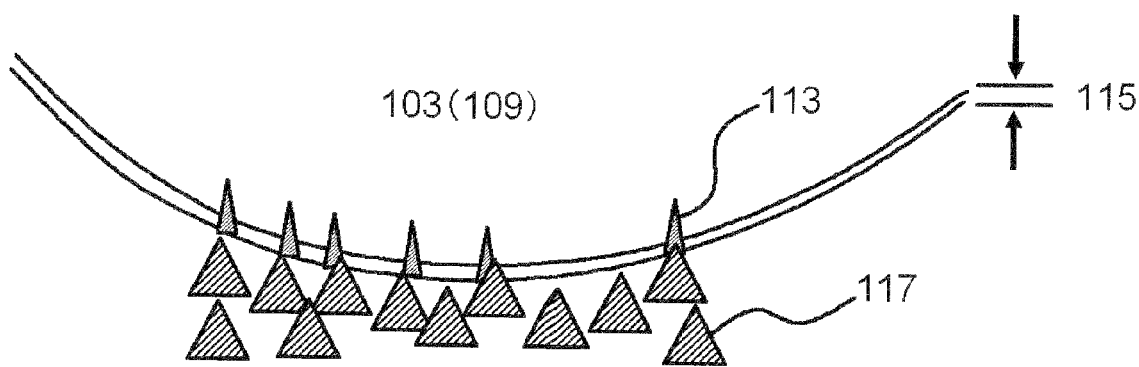
FIG. 2 is a view illustrating the semiconductor device according to the embodiment.
Figure 3:
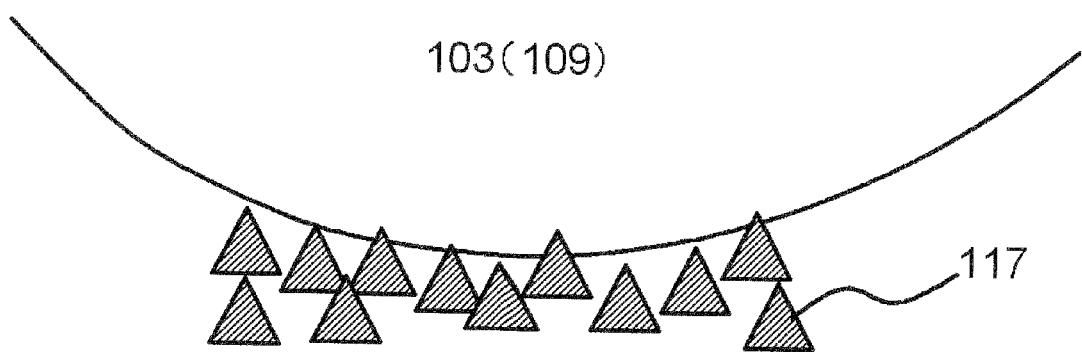
FIG. 3 is a view illustrating a conventional semiconductor device.

There is a problem in the oxide films 115 formed on the solder balls 109 (103) that the wettability and spreadability of the solder become poor, and defects in mounting (failure in fusion of solder) easily occur between the solder paste 117 applied to the substrate to be mounted and the solder balls 109 (103) on the substrate at the time of reflow for mounting in accordance with the specifications of the customer. In order to solve this problem, the oxide films are removed using a polishing type cleaner, a plasma process or an organic compound in the conventional art so that solder balls 109 (103) as shown in FIG. 3 are obtained, and after that, a solder paste 117 is applied and the solder balls are mounted onto the substrate. However, static electricity is generated in the conventional art, and therefore, a problem arises where the quality of the semiconductor chip is lowered due to electrostatic breakdown. Meanwhile, according to the present embodiment, as shown in FIG. 2, through holes 113 are formed in the oxide films 115 formed on the solder balls 109 (103). As a result, the through holes 113 are filled in with a solder paste 117 in the region where the through holes 113 are formed, and therefore, the solder paste 117 wets and spreads appropriately. In addition, a configuration where the oxide films are positively removed is not adopted, and therefore, no static electricity is generated. Accordingly, it becomes possible to increase the yield in assembly and the quality of bonding while reducing the defects in mounting.

Though an embodiment of the present invention is described above with reference to the drawings, this is an example of the present invention and various configurations in addition to the above can be adopted.

Though the configuration where a part is bonded to a BGA substrate or a printed circuit board is illustrated in the embodiment, it can be bonded to a member which makes electrical connection possible. In addition, though a configuration where bonding is achieved via solder balls is illustrated in the embodiment, it is possible to use terminals which make connection between a substrate and a semiconductor chip possible as long as oxide films are formed on the terminals. At this time, a conductive bonding agent may be used instead of the solder paste.

In addition, though a configuration where a semiconductor chip is mounted on a BGA substrate and a configuration where the semiconductor chip mounted on the BGA substrate is mounted on a printed circuit board are illustrated in the embodiment, the semiconductor chip may be mounted on a member which makes electrical connection possible, such as a substrate, in accordance with predetermined timing after the formation of through holes in the solder balls.

It is apparent that the present invention is not limited to the above embodiment, and may be modified and changed without departing from the scope and spirit of the invention.

What is claimed is:

1. A semiconductor device, comprising:
a semiconductor element; and
external connection terminals provided on said semiconductor element,
wherein said external connection terminals comprise inner parts of said external connection terminals and oxide films covering said inner parts of said external connection terminals, and through holes extend into said inner parts of said external connection terminals through said oxide films such that the inner parts of the external connection terminals are exposed without the external connection terminals being electrically contacted with an electrical connection member.

2. The semiconductor device according to claim 1, wherein the depth of said through holes is deeper than the thickness of said oxide films.

3. The semiconductor device according to claim 1, wherein said semiconductor element comprises:
   a semiconductor chip;
   first solder balls connected to said semiconductor chip; and
   a BGA substrate, said semiconductor chip being mounted on said BGA substrate,
   wherein said first solder balls comprise inner parts of said first solder balls and oxide films of said first solder balls covering said inner parts of said first solder balls, and through holes of said first solder balls extend into said inner parts of said first solder balls through said oxide film of said first solder balls, and
   wherein said through holes of said first solder balls are filled with solder paste being electrically conductive.

4. The semiconductor device according to claim 3, wherein said external connection terminals are second solder balls.

5. The semiconductor device according to claim 4, wherein said first and second solder balls are made of a tin-copper alloy based material.

6. The semiconductor device according to claim 3, wherein said first solder balls have said solder paste on the surface thereof.

7. The semiconductor device according to claim 6, wherein said solder paste includes tin, silver and copper.

8. The semiconductor device according to claim 1, wherein said through holes are filled with a solder paste being electrically conductive.

9. A method of manufacturing a semiconductor device, comprising:
   forming external connection terminals on said semiconductor element;
   forming through holes in oxide films formed on the surface of said external connection terminals and into said external connection terminals to expose inner portions of the external connection terminals; and
   electrically connecting the exposed inner portions of the external connection terminals to a printed circuit wiring board after forming the through holes.

10. The method of manufacturing a semiconductor device according to claim 9, wherein said forming external connection terminals on said semiconductor element includes:
   mounting a semiconductor chip on a BGA substrate via first solder balls; and
   forming said external terminals on a surface of said BGA substrate that is opposing to a surface on which said semiconductor chip is mounted.

11. The method of manufacturing a semiconductor device according to claim 10, wherein said mounting said semiconductor chip on said BGA substrate via said first solder balls comprises:
   connecting said first solder balls on said semiconductor chip;
   forming through holes in oxide films formed on a surface of said first solder balls;
   applying a solder paste on conductive pads of said BGA substrate, said solder paste being electrically conductive;
   arranging said first solder balls on said conductive pads of said BGA substrate on which said solder paste is applied, so that said through holes are filled with said solder paste; and
   connecting said first solder balls to said conductive pads of said BGA substrate through reflow method.

12. The method of manufacturing a semiconductor device according to claim 10, wherein said external connection terminals are second solder balls.

13. The method of manufacturing a semiconductor device according to claim 12, wherein said first and second solder balls are made of a tin-copper alloy based material.

14. The method of manufacturing a semiconductor device according to claim 9, wherein said forming through holes includes using a crown form tool.

15. The method of manufacturing a semiconductor device according to claim 9, wherein said through holes are formed along top and peripheral portions of said external connection terminals.

16. The method of manufacturing a semiconductor device according to claim 15, wherein said external connection terminals include solder balls.

17. The method of manufacturing a semiconductor device according to claim 9, wherein a depth of said through holes is deeper than a thickness of said oxide films.

18. The semiconductor device according to claim 9, further comprising:
   applying a solder paste on the printed circuit wiring board, the solder paste being electrically conductive;
   arranging said external connection terminals on said wiring board on which said solder paste is applied, so that said through holes are filled with said solder paste; and
   connecting said external connection terminals to said wiring board through reflow method.

19. A semiconductor device, comprising:
   a semiconductor element; and
   solder balls provided on said semiconductor element,
   wherein said solder balls comprise inner parts of said solder balls and oxide films covering said inner parts of said solder balls, and through holes extend into said inner parts of said solder balls through said oxide films, and
   wherein said through holes are filled with a solder paste being electrically conductive.

* * * * *